(12) United States Patent
Bedell et al.

(10) Patent No.: US 7,084,050 B2
(45) Date of Patent: Aug. 1, 2006

(54) FORMATION OF SILICON-GERMANIUM-ON-INSULATOR (SGOI) BY AN INTEGRAL HIGH TEMPERATURE SIMOX-GE INTERDIFFUSION ANNEAL

(75) Inventors: Stephen W. Bedell, Wappingers Falls, NY (US); Joel P. de Souza, Putnam Valley, NY (US); Keith E. Fogel, Mohegan Lake, NY (US); Devendra K. Sadana, Pleasantville, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/039,602

(22) Filed: Jan. 19, 2005

(65) Prior Publication Data

US 2005/0153487 A1    Jul. 14, 2005

Related U.S. Application Data

(60) Division of application No. 10/696,601, filed on Oct. 29, 2003, now Pat. No. 6,861,158, which is a continuation-in-part of application No. 10/448,947, filed on May 30, 2003, now Pat. No. 6,855,436.

(51) Int. Cl.
*H01L 21/20* (2006.01)
*H01L 21/76* (2006.01)
*H01L 21/31* (2006.01)

(52) U.S. Cl. ............... 438/480; 438/407; 438/766
(58) Field of Classification Search ........ 438/480; 257/E21.092
See application file for complete search history.

(56) References Cited

U.S. PATENT DOCUMENTS

| | | | |
|---|---|---|---|
| 4,866,498 A | 9/1989 | Myers | |
| 5,461,243 A | 10/1995 | Ek et al. | |
| 5,563,428 A | 10/1996 | Ek et al. | |
| 5,667,586 A | 9/1997 | Ek et al. | |
| 5,759,898 A | 6/1998 | Ek et al. | |
| 5,846,867 A | 12/1998 | Gomi et al. | |
| 6,118,151 A | 9/2000 | Tsutsu | |
| 6,190,975 B1 | 2/2001 | Kubo et al. | |
| 6,515,335 B1 | 2/2003 | Christiansen et al. | |
| 6,593,625 B1 | 7/2003 | Christiansen et al. | |
| 6,607,948 B1 | 8/2003 | Sugiyama et al. | |
| 6,617,034 B1 * | 9/2003 | Hamaguchi et al. | 428/446 |
| 2002/0030227 A1 | 3/2002 | Bulsara et al. | |
| 2002/0185686 A1 | 12/2002 | Christiansen et al. | |
| 2003/0139000 A1 | 7/2003 | Bedell et al. | |
| 2003/0211711 A1 * | 11/2003 | Seki et al. | 438/480 |
| 2004/0012075 A1 | 1/2004 | Bedell et al. | |

* cited by examiner

*Primary Examiner*—Ha Nguyen
*Assistant Examiner*—Cheung Lee
(74) *Attorney, Agent, or Firm*—Scully, Scott, Murphy & Presser, P.C.; Robert M. Trepp, Esq.

(57) ABSTRACT

A method of forming a substantially relaxed, high-quality SiGe-on-insulator substrate material using SIMOX and Ge interdiffusion is provided. The method includes first implanting ions into a Si-containing substrate to form an implanted-ion rich region in the Si-containing substrate. The implanted-ion rich region has a sufficient ion concentration such that during a subsequent anneal at high temperatures a barrier layer that is resistant to Ge diffusion is formed. Next, a Ge-containing layer is formed on a surface of the Si-containing substrate, and thereafter a heating step is performed at a temperature which permits formation of the barrier layer and interdiffusion of Ge thereby forming a substantially relaxed, single crystal SiGe layer atop the barrier layer.

33 Claims, 7 Drawing Sheets

FORMATION OF SILICON-GERMANIUM-ON-INSULATOR (SGOI) BY AN INTEGRAL HIGH TEMPERATURE SIMOX-GE INTERDIFFUSION ANNEAL

RELATED APPLICATION

This application is a divisional application of U.S. Ser. No. 10/696,601, filed Oct. 29, 2003 now U.S. Pat. No. 6,861,158, which application is a continuation-in-part (CIP) application of co-assigned U.S. Ser. No. 10/448,947, filed May 30, 2003 now U.S. Pat. No. 6,855,436, which application is related to co-pending and co-assigned U.S. patent application Ser. No. 10/055,138, filed Jan. 23, 2002, entitled "Method of Creating High-Quality Relaxed SiGe-On-Insulator for Strained Si CMOS Applications". The entire contents of each of these related applications are incorporated herein by reference.

FIELD OF THE INVENTION

The present invention relates to a method of fabricating a semiconductor substrate material, and more particularly to a method of fabricating a substantially relaxed, high-quality SiGe alloy crystal layer over an insulating layer by combining aspects of silicon-on-insulator (SOI) formation with the interdiffusion of a Ge-containing layer. The method of the present invention provides substantially relaxed, high-quality SiGe-on-insulator substrate materials that can be used as a lattice mismatched template for creating a strained Si layer thereon by subsequent Si epitaxial overgrowth. Such strained Si layers have high carrier mobility and are useful in high-performance complementary metal oxide semiconductor (CMOS) applications. The present invention is also directed to SiGe-on-insulator substrate materials as well as structures that include at least the SiGe-on-insulator substrate material.

The present invention also provides a silicon germanium-on-insulator (SGOI) substrate having the necessary properties required for use in modem CMOS IC manufacturing. For instance, Ge atoms can diffuse through a poorly formed buried diffusion barrier and thus conditions must be chosen to form a continuous layer as early in the anneal as possible to minimize Ge loss into the underlying substrate. The surface of SiGe alloys tends to form pits at high oxidation temperatures (>1250° C.) which need to be minimized. It is also important that the diffusion barrier layer formed be of a sufficient electrical quality to be useful in CMOS processing. The SiGe crystal defects need to be minimized to ensure that the operation of devices formed thereon is not compromised. The present invention thus also provides optimized conditions which address the aforementioned challenges.

BACKGROUND OF THE INVENTION

In the semiconductor industry, silicon-on-insulator substrates may be formed using a process referred to in the art as separation by ion implantation of oxygen (SIMOX). In a SIMOX process, a Si wafer is implanted with oxygen at high doses (on the order of 5E16 atoms/cm$^2$ or greater) and then annealed and oxidized at very high temperatures (on the order of about 1300° C. or greater) to form a well-defined and continuous buried oxide layer below the surface of the Si wafer. The high-temperature anneal serves both to chemically form the buried oxide layer as well as to annihilate any defects that persist in the near-surface silicon layer by annealing near the melting point of silicon.

Because of the recent high-level of activity using strained Si-based heterostructures, there is a need for providing SiGe-on-insulator (SGOI) substrates in which the SiGe layer is substantially relaxed and of high-quality. SGOI substrates may be formed using various processes including, for example, the SIMOX process. In the prior art, a thick SiGe layer having a thickness of about 1 to about 5 micrometers is first deposited atop a Si wafer and then the SIMOX process is performed. Such a prior art process suffers the following two drawbacks: 1) the Ge tends to diffuse into the bulk before a continuous oxide layer is formed and 2) the presence of Ge near the O peak inhibits the formation of a high-quality buried oxide layer unless the Ge concentration is very low.

In view of the drawbacks with prior art SIMOX processes of forming a SGOI substrate material, there is a need for providing a new and improved SIMOX method that reduces the tendency of Ge to diffuse into bulk Si before a continuous buried insulating layer is formed and provides a relaxed, high-quality SiGe alloy layer atop a buried insulating layer.

SUMMARY OF THE INVENTION

One object of the present invention is to provide a method of fabricating thin, high-quality, substantially relaxed SiGe-on-insulator substrate materials.

Another object of the present invention is to provide a method of fabricating thin, high-quality, substantially relaxed SiGe-on-insulator substrate materials that are stable against further defect production such as misfit and threading dislocations.

A further object of the present invention is to provide a method of fabricating thin, high-quality, substantially relaxed SiGe-on-insulator substrate materials that is compatible with CMOS processing steps.

A yet further object of the present invention is to provide a method of fabricating thin, high-quality, substantially relaxed SiGe-on-insulator substrate materials which can then be used as lattice mismatched templates, i.e., substrates, for forming strained Si-containing layers.

A still further object of the present invention is to provide strained Si/substantially relaxed SiGe-on-insulator structures that have high carrier mobility and are useful in high-performance CMOS applications.

An even further object of the present invention is to provide a method of fabricating a substantially relaxed, high-quality SiGe alloy crystal layer over an insulating layer by combining aspects of silicon-on-insulator (SOI) formation with the interdiffusion of a Ge-containing layer.

Another object of the present invention is to provide a method of fabricating a substantially relaxed, high-quality SiGe-on-insulator substrate material that takes advantage of the defect annihilation properties of a SIMOX anneal, while allowing the formation of a substantially relaxed, high-quality SiGe alloy crystal layer over a buried insulating layer that is highly resistant to Ge diffusion.

A still other object of the present invention is to provide optimized conditions for fabricating a high-quality SiGe-on-insulator substrate material which are capable of (1) providing sufficient electrical quality to the diffusion barrier layer; (2) minimizing Ge loss; (3) minimizing surface pit formation in the SiGe alloy layer; and (4) minimizing SiGe crystal defects.

These and other objects and advantages are achieved in the present invention by utilizing a method that includes first implanting ions, such as oxygen ions, into a Si-containing substrate to form an implanted-ion rich (which can also be referred to as an implant rich region) region in the Si-containing substrate. The implanted-ion rich region has a sufficient ion concentration such that during a subsequent anneal at high temperatures a barrier layer that is resistant to Ge diffusion is formed. Next, a Ge-containing layer, such as SiGe or pure Ge, is formed on a surface of the Si-containing substrate, and thereafter a heating step is performed at a temperature which permits formation of the barrier layer and interdiffusion of Ge thereby forming a substantially relaxed, single crystal SiGe layer atop the barrier layer. It is noted that the substantially relaxed, single crystal layer is comprised of a homogeneous mixture of at least the SiGe or pure Ge layer and part of the Si-containing substrate that exists above the implanted-ion rich region.

Following these steps of the present invention, a strained Si-containing layer may be grown epitaxially atop the substantially relaxed single crystal SiGe layer to form a strained Si-containing/relaxed SiGe-containing heterostructure that can be used in a variety of high-performance CMOS applications.

The present method also contemplates forming barrier layers that are unpatterned (i.e., barrier layers that are continuous) or patterned (i.e., discrete and isolated barrier regions or islands which are surrounded by semiconductor material).

In yet another embodiment of the present invention, a Si-containing cap layer is formed atop the Ge-containing layer prior to heating the structure. This embodiment of the present invention alters the thermodynamic stability of the SiGe layer in order to prevent defect production during annealing. The SiGe layer has a thickness of about 2000 nm or less, with a thickness from about 10 to about 200 nm being more highly preferred.

In another embodiment of the present invention, a Si-containing "buffer" layer is formed atop the Si-containing substrate prior to formation of the Ge-containing layer. This embodiment provides an alternate method of controlling the depth of the implanted-ion rich region below the surface. The Si-containing buffer layer has a thickness greater than 10 nm, with a thickness of from about 20 to 2000 nm being more highly preferred.

In still another embodiment of the present invention, optimal conditions for the implant step and heating step are provided which are capable of forming a high-quality SGOI substrate material that is of a sufficient electrical quality to be useful in modem CMOS applications whereby the substrate exhibits minimized Ge loss; minimized surface pit formation; and minimized SiGe crystal defects. Specifically, and in this embodiment of the present invention, applicants have determined the optimal implant conditions, SiGe growth conditions, thermal annealing/oxidation conditions and post thermal processing conditions that provide a high-quality SGOI substrate material. The post thermal processing conditions include a non-selective thinning step that thins the SiGe alloy layer to a desired thickness, while reducing the number of surface pit defects that are present in the SiGe alloy layer.

Another aspect of the present invention relates to the SiGe-on-insulator substrate material that is formed utilizing the above-mentioned processing steps. Specifically, the inventive substrate material comprises a Si-containing substrate; an insulating region that is resistant to Ge diffusion present atop the Si-containing substrate; and a substantially relaxed SiGe layer present atop the insulating region, wherein the substantially relaxed SiGe layer has a thickness of about 2000 nm or less. A characteristic feature of the inventive SiGe-on-insulator substrate material is that it has a defect density that is typical of contemporary SGOI material. Specifically, the SiGe-on-insulator substrate material of the present invention has a measured defect density of about $5 \times 10^7$ cm$^{-2}$ or less.

A yet further aspect of the present invention relates to a heterostructure which includes at least the above-mentioned substrate material. Specifically, the heterostructure of the present invention comprises a Si-containing substrate; an insulating region that is resistant to Ge diffusion present atop the Si-containing substrate; a substantially relaxed SiGe layer present atop the insulating region, wherein the substantially relaxed SiGe layer has a thickness of about 2000 nm or less; and a strained Si-containing layer formed atop the substantially relaxed SiGe layer.

Other aspects of the present invention relate to superlattice structures as well as templates for other lattice mismatched structures which include at least the SiGe-on-insulator substrate material of the present invention.

DETAILED DESCRIPTION OF THE INVENTION

Figure 1A:
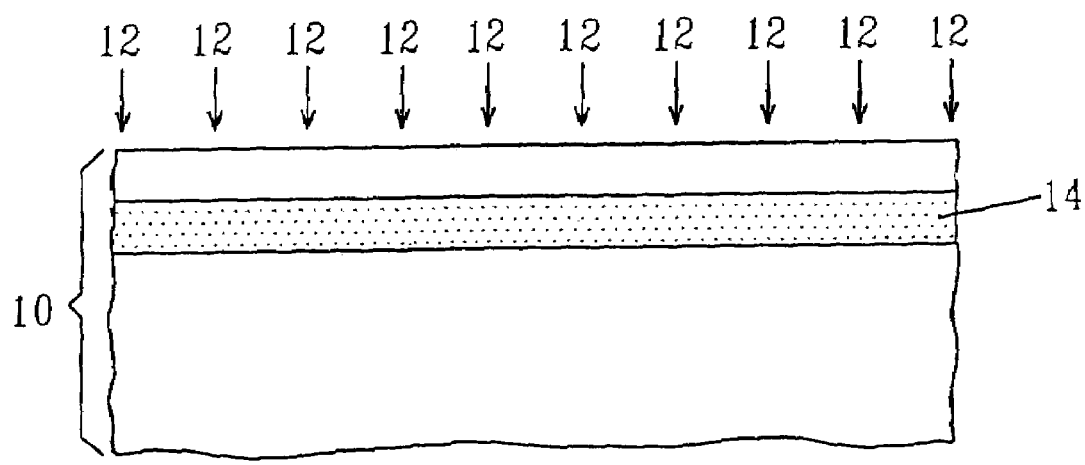
FIGS. 1A–1D are pictorial representations (through cross-sectional views) showing the basic processing steps that are employed in the present invention in fabricating a thin, high-quality, substantially relaxed SiGe-on-insulator substrate material. In these drawings, a continuous, i.e., unpatterned, barrier layer that is resistant to Ge diffusion is formed.

The present invention, which provides a method of fabricating thin, high-quality, substantially relaxed SiGe-on-insulator substrate materials which can then serve as a lattice mismatched template for subsequent overgrowth of an epitaxial Si-containing layer, will now be described in greater detail by referring to the drawings the accompany the present application. In the accompanying drawings, like and/or corresponding elements are referred to by like reference numerals. It is also noted that the following description will describe the optimal conditions that can be used in forming a high-quality SiGe-on-insulator substrate material whereby the electrical quality of the diffusion barrier is improved, while minimizing: (i) surface pits in the SiGe alloy layer, (ii) Ge loss, and (iii) SiGe crystal defects.

Reference is first made to FIGS. 1A–1D which illustrate the basic processing steps of the present invention. Specifically, FIG. 1A shows the first processing step of the present invention in which ions 12 are implanted into a Si-containing substrate 10 so as to form an implanted-ion rich region 14 in the Si-containing substrate 10. The implanted-ion rich region 14 may be simply referred to as an implant rich region 14. As illustrated, the implanted-ion rich region 14 is located beneath a surface layer of Si-containing substrate 10. The term "Si-containing" as used herein denotes a semiconductor substrate that includes at least silicon. Illustrative examples include, but are not limited to: Si, SiGe, SiC, SiGeC, Si/Si, Si/SiC, Si/SiGeC, and preformed silicon-on-insulators which may include any number of buried oxide (continuous, non-continuous or mixtures of continuous and non-continuous) regions present therein.

The ions 12 that are implanted into the Si-containing substrate 10 at this point of the present invention are any ions that are capable of forming a barrier layer that is resistant to Ge diffusion when subjected to a subsequent heating step. Illustrative examples of such ions include, but are not limited to: oxygen ions, nitrogen ions, NO ions, inert gases and mixtures thereof. Preferred ions 12 that are implanted into the Si-containing substrate 10 at this point of the present invention are atomic or molecular oxygen ions.

The ions 12 are implanted into the Si-containing substrate 10 in a sufficient concentration that forms an implanted-ion rich region 14 in the Si-containing substrate. The implanted-ion rich region 14 formed at this point of the present invention has an ion concentration that is sufficient to form a barrier layer resistant to Ge diffusion in the Si-containing substrate when subjected to a subsequent heating step. Typically, the implanted-ion rich region 14 formed in this step of the present invention has an ion concentration of about $1 \times 10^{22}$ atoms/cm$^3$ or greater.

The implanted-ion rich region 14 is formed below the upper surface of Si-containing substrate 10 such that a surface layer of Si-containing material lies atop the implanted-ion rich region 14. Typically, the implanted-ion rich region 14 is formed about 50 nm or greater below the upper surface of the Si-containing substrate 10.

Figure 2A:
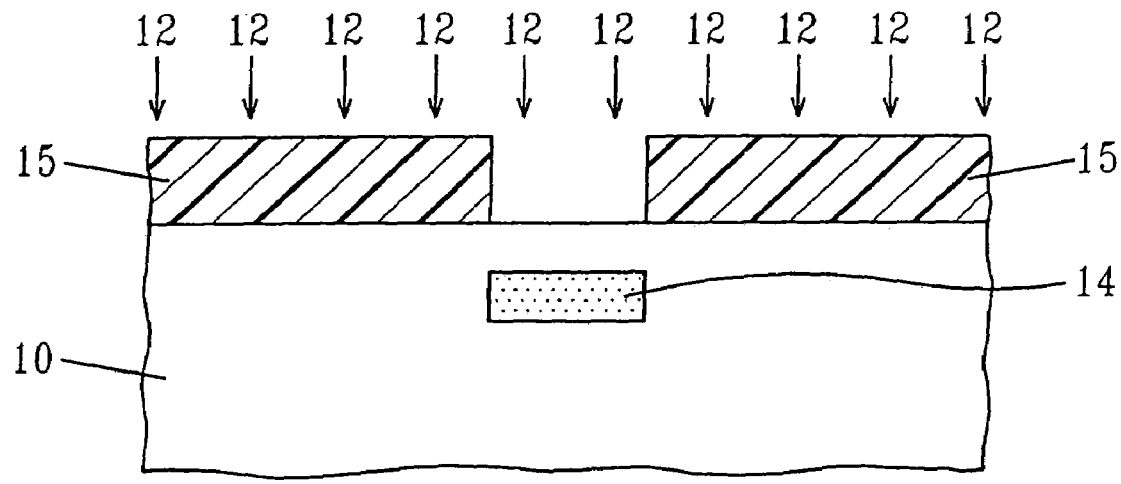
FIGS. 2A–2D are pictorial representations (through cross-sectional views) showing the basic processing steps that are employed in an alternative embodiment of the present invention in fabricating a thin, high-quality, substantially relaxed SiGe-on-insulator substrate material. In these drawings, a patterned barrier layer that is resistant to Ge diffusion is formed.
Figure 2B:
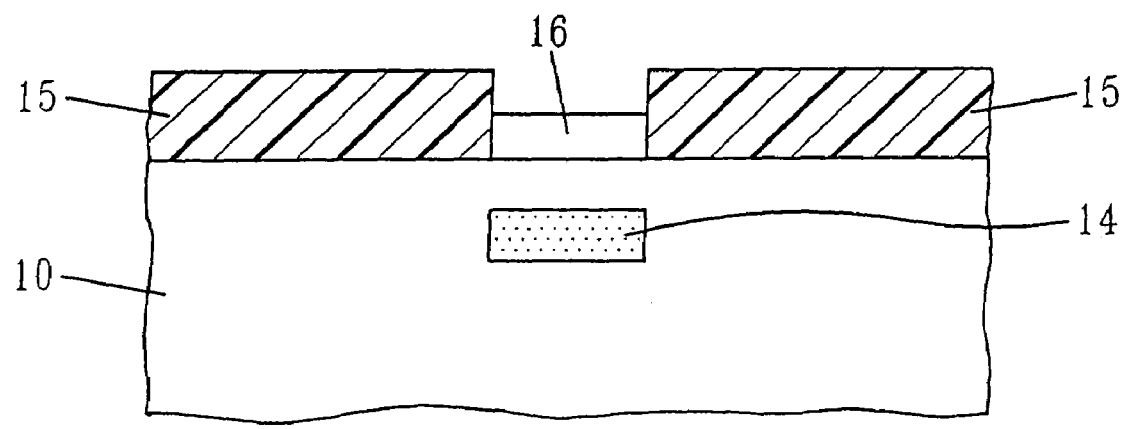

The ions 12 are implanted using SIMOX processes and conditions that are well known to those skilled in the art, as well as the various SIMOX processes and conditions mentioned in co-assigned U.S. patent applications Ser. Nos. 09/861,593, filed May 21, 2001; 09/861,594, filed May 21, 2001; 09/861,590, filed May 21, 2001; 09/861,596, filed May 21, 2001; and 09/884,670, filed Jun. 19, 2001 as well as U.S. Pat. No. 5,930,634 to Sadana, et al., the entire contents of each are being incorporated herein by reference. The implant may be a blanket implant as shown in FIG. 1A or a patterned implant as shown in FIG. 2A may be employed. The patterned implant may include a mask formed directly on the upper surface of the Si-containing substrate 10 or a mask that is located some distance from the upper surface of the Si-containing substrate 10 may be employed.

Although various implant conditions can be employed in the present invention, the following provides general implant conditions for forming an implanted-ion rich region 14 in the Si-containing substrate 10:

I. High-dose ion implantation: The term "high-dose" as used herein denotes an ion dosage of about 4E17 cm$^{-2}$ or greater, with an ion dosage from about 4E17 to about 2E18 cm$^{-2}$ being more preferred. In addition to using high-ion dosage, this implant is typically carried out in an ion implantation apparatus that operates at a beam current density from about 0.05 to about 500 milliamps cm$^{-2}$ and at an energy from about 50 to about 1000 keV. More preferably, this implant is carried out using an energy from about 150 to about 210 keV.

This implant, which may be referred to as a base ion implant, is carried out at a temperature from about 200° C. to about 800° C. at a beam current density from about 0.05 to about 500 mA cm$^{-2}$. More preferably, the base ion implant may be carried out at a temperature from about 200° C. to about 600° C. at a beam current density from about 5 to about 10 mA cm$^{-2}$.

If desired, the base ion implant step may be followed by a second oxygen implant that is carried out using an ion dose from about 1E14 to about 1E16 cm$^{-2}$, with an ion dose from about 1E15 to about 4E15 cm$^{-2}$ being more highly preferred. The second ion implant is carried out at an energy of from about 40 keV or greater, with an energy from about 120 to about 450 keV being more preferred.

This second implant is performed at a temperature from about 4 K to about 200° C. with a beam current density from about 0.05 to about 10 mA cm$^{-2}$. More preferably, the second ion implant may be performed at a temperature from about 25° C. to about 100° C. with a beam current density from about 0.5 to about 5.0 mA cm$^{-2}$.

Note that the second ion implant forms an amorphous region that is shallower the damaged region caused by the base ion implant step. During the subsequent heating step of the present invention, the amorphous and damaged region become part of a barrier layer that is resistant to Ge diffusion.

II. Low-dose ion implant: The term "low-dose" as used herein for this embodiment of the present invention denotes an ion dose of about 4E17 cm$^{-2}$ or less, with an ion dose from about 1E16 to about 3.9E17 cm$^{-2}$ being more preferred. This low-dose implant is performed at an energy from about 40 to about 10000 keV, with an implant energy from about 40 to about 210 keV being more highly preferred.

This implant, which may be referred to as a base ion implant, is carried out at a temperature from about 100° C. to about 800° C. More preferably, the base ion implant may be carried out at a temperature from about 200° C. to about 650° C. with a beam current density from about 0.05 to about 500 mA cm$^{-2}$.

The low-dose base implant step is preferably followed by a second ion implant that is carried out using the conditions mentioned above.

It is again emphasized that the above types of implant conditions are exemplary and by no way limit the scope of the present invention. Instead, the present invention contemplates all conventional ion implants that are typically employed in conventional SIMOX processes.

In a preferred embodiment of the present invention, a low-dose oxygen ion implant step is performed utilizing the following optimal conditions for the base ion implant step and the second ion implant step. In this embodiment of the present invention, oxygen ions are implanted into the Si-containing substrate 10 using a base ion implant step and a second ion implant step. Specifically, the base oxygen ion implant step is performed at an optimal energy from about 100 to about 220 keV and at an optimal dose from about 1.5E17 to about 3E17 cm$^{-2}$. More preferably, the base oxygen ion implant step is performed at an optimal energy from about 150 to about 175 keV and at an optimal dose from about 1.8E17 to about 2.75E17 cm$^{-2}$.

Other optimal conditions for the base oxygen implant step include: an implant temperature from about 200° C. to about 600° C., with a base oxygen implant temperature from about 200° C. to about 450° C. being more highly preferred. The optimal beam current density for the base oxygen implant step is from about 0.01 to about 0.1 mA cm$^{-2}$.

After performing the base oxygen implant step using the aforementioned optimal implant conditions, a second oxygen implant step, which is performed at a lower temperature than the base oxygen implant step, is employed. The second oxygen implant step is performed at an optimal energy from about 100 to about 220 keV at an optimal oxygen dose from about 1E15 to about 3E15 cm$^{-2}$. More preferably, the second oxygen implant step is performed at optimal energy from about 150 to about 170 keV at an optimal oxygen dose from about 2E15 to about 2.75E15 cm$^{-2}$.

The second oxygen implant is performed at an optimal implant temperature from about −200° C. to about 150° C., with an optimal implant temperature from about 20° C. to about 100° C. being more highly preferred. The optimal beam current density for the second oxygen implant step is from about 0.001 to about 0.1 mA cm$^{-2}$.

Using the optimal conditions mentioned above, the second oxygen implant forms an amorphous region that is shallower than the damaged region created by the optimal base oxygen implant step. That is, the second implant displaces the peak of the implant closer to the surface of the substrate than the base implant. Specifically, the amorphous region created by the second oxygen implant steps is from about 0 to about 500 Å shallower than the damaged region created by the base oxygen implant step. More specifically, the amorphous region is about 150 to about 250 Å shallower than the damaged region created by the base oxygen implant step.

It again emphasized that the aforementioned optimal implant conditions are used in a preferred embodiment of the present invention to provide a high-quality SiGe-on-insulator substrate material. It is noted that the low-dose implant regime is preferred over the high-dose implant regime since the low-dose regime provides a higher quality thermal oxide as compared to oxide formed from implanted oxygen. Moreover, the low-dose regime provides a diffusion barrier in the final SiGe-on-insulator substrate material that exhibits a mini-breakdown voltage that is less than that of a diffusion barrier provided by a high-dose implant regime. In the case wherein the optimal conditions are employed, the diffusion barrier is a buried oxide having a mini-breakdown electric field of about 6 MV/cm or more.

In some embodiments (not shown), a Si-containing buffer layer is formed atop the Si-containing substrate 10 prior to formation of the Ge-containing layer 16. This particular embodiment provides an alternative method for controlling the depth of the implanted-ion rich region 12 below the surface. When employed, the Si-containing buffer layer has a thickness greater than 10 nm, with a thickness from about 20 to 2000 nm being more preferred.

Figure 1B:
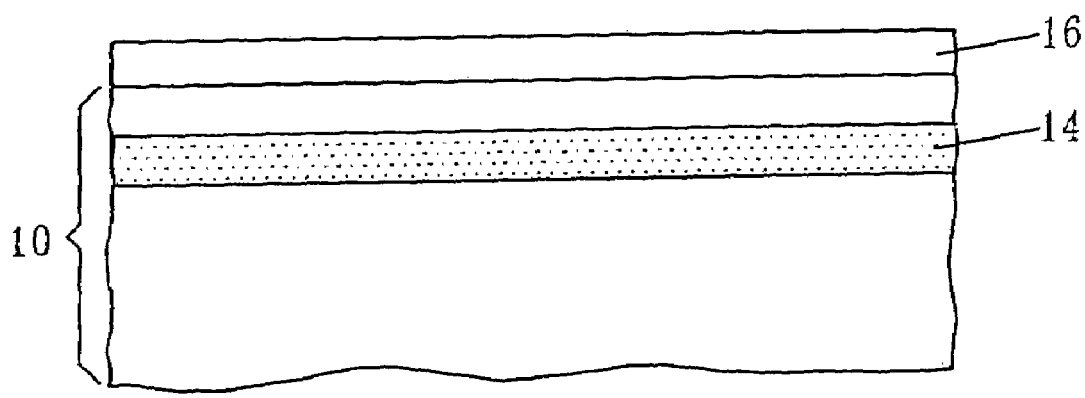

FIG. 1B illustrates the structure that is formed after a Ge-containing layer 16 is formed atop the upper surface of Si-containing substrate 10. The Ge-containing layer 16 formed at this point of the present invention may be a SiGe alloy layer or a pure Ge layer. The term "SiGe alloy layer" includes SiGe alloys that comprise up to 99.99 atomic percent Ge, whereas pure Ge includes layers that comprise 100 atomic percent Ge. When SiGe alloy layers are employed, it is preferred that the Ge content in the SiGe alloy layer be from about 0.1 to about 99.9 atomic percent, with a Ge atomic percent of from about 10 to about 35 being even more highly preferred.

In accordance with the present invention, the Ge-containing layer 16 is formed atop an upper surface of the Si-containing substrate 10 using any conventional epitaxial growth method that is well known to those skilled in the art which is capable of (i) growing a thermodynamically stable (below a critical thickness) SiGe alloy or pure Ge layer, (ii) growing a SiGe alloy or pure Ge layer that is metastable and free from defects, i.e., misfit and TD dislocations, or (iii) growing a partially or fully relaxed SiGe layer; the extent of relaxation being controlled by growth temperature, Ge concentration, thickness, or the presence of a Si capping layer.

Illustrative examples of such epitaxial growing processes that are capable of satisfy conditions (i), (ii) or (iii) include, but are not limited to: low-pressure chemical vapor deposition (LPCVD), ultra-high vacuum chemical vapor deposition (UHVCVD), atmospheric pressure chemical vapor deposition (APCVD), molecular beam (MBE) epitaxy and plasma-enhanced chemical vapor deposition (PECVD).

In some embodiments of the present invention, it is desirable to form SiGe layers with a reduced variation in isotopic masses. This can be accomplished by growing epitaxial SiGe layers from a Ge source that is substantially composed of $^{74}$Ge, for example: Other Ge sources include $^{70}$Ge, $^{72}$Ge, $^{73}$Ge or $^{76}$Ge. SiGe layers with reduced isotopic mass variation have improved thermal conductivity compared to equivalent layers with a naturally occurring distribution of isotopic mass.

The thickness of the Ge-containing layer 16 formed at this point of the present invention may vary, but typically the Ge-containing layer 16 has a thickness from about 10 to about 500 nm, with a thickness from about 20 to about 200 nm being more highly preferred.

In another embodiment of the present invention, the optimal conditions for growing the Ge-containing layer 16 include a thickness from about 50 to about 500 nm, with a thickness from about 100 to about 200 nm being more highly preferred. The optimal Ge content in the Ge-containing layer 16 is within the range from about 5 to about 40 atomic percent, with an optimal Ge content from about 15 to about 25 atomic percent being more highly preferred.

Figure 3A:
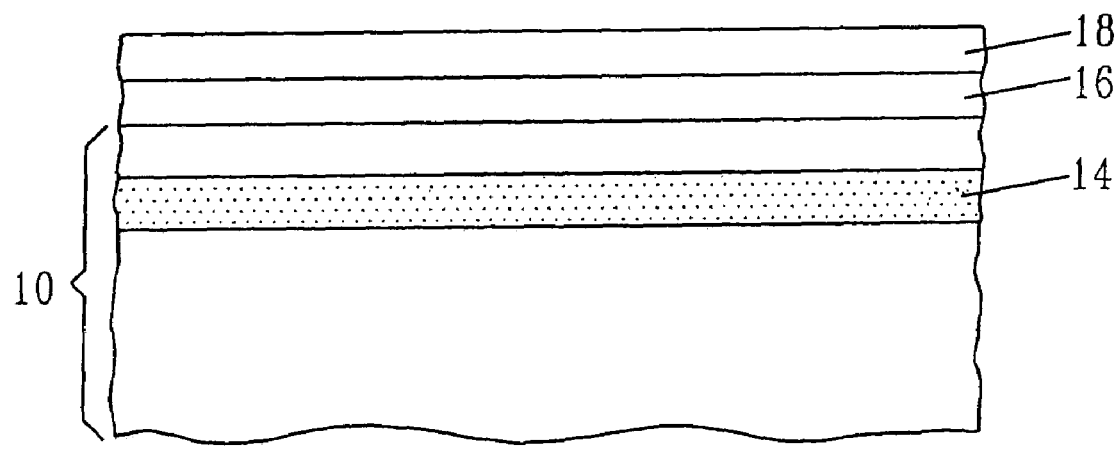
FIGS. 3A–3B are pictorial representations (through cross-sectional views) showing an alternative embodiment of the present invention wherein a Si cap layer is formed atop a Ge-containing layer which is formed on the structure shown in FIG. 1B or the structure shown in FIG. 2B.
Figure 3B:
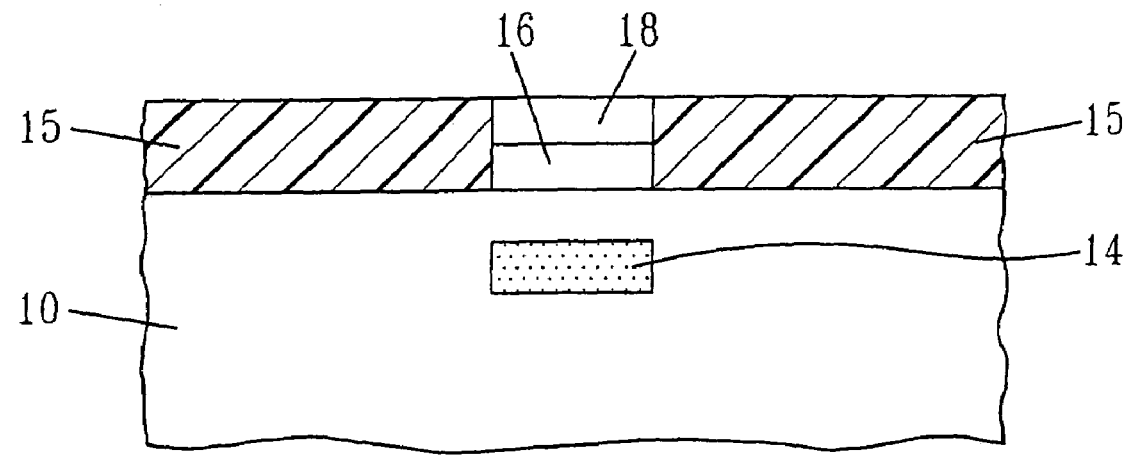

In an alternative embodiment of the present invention, see FIG. 3A–3B, optional cap layer 18 is formed atop Ge-containing layer 16 prior to performing the heating step of the present invention. The optional cap layer employed in the present invention comprises any Si or Si-containing material including, but not limited to: epitaxial silicon (epi-Si), epitaxial silicon-germanium (epi-SiGe), amorphous silicon (a:Si), amorphous silicon-germanium (a:SiGe), single or polycrystalline Si or any combination thereof including multilayers. In a preferred embodiment, the cap layer 18 is comprised of epi Si. It is noted that layers 16 and 18 may, or may not, be formed in the same reaction chamber.

When present, optional cap layer 18 has a thickness from about 1 to about 100 nm, with a thickness from about 1 to about 30 nm being more highly preferred. The optional cap layer 18 is formed utilizing any well-known deposition process including the epitaxial growth processes mentioned above.

In one embodiment of the present invention, it is preferred to form a pure Ge or SiGe alloy (15 to 20 atomic percent Ge) layer 16 having a thickness from about 1 to about 2000 nm on the surface of the Si-containing substrate 10, and thereafter form a Si cap layer 18 having a thickness from about 1 to about 100 nm atop the Ge or SiGe layer.

Figure 1C:
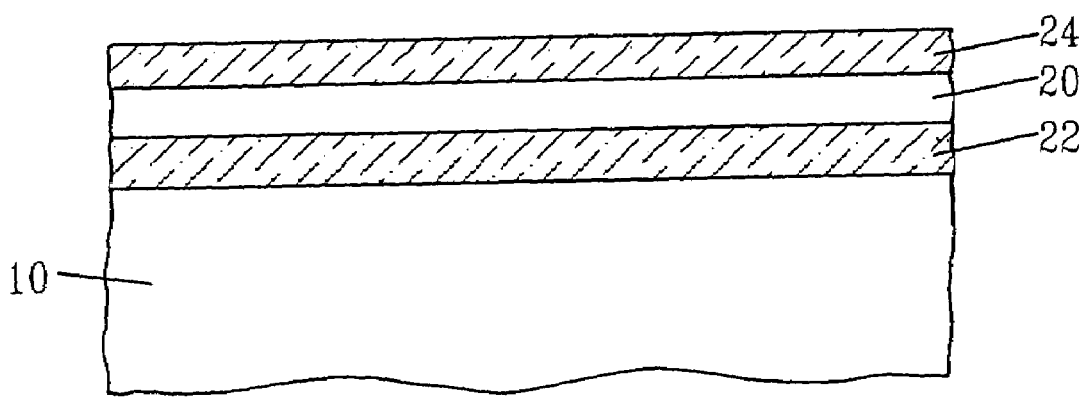

After forming the Ge-containing layer 16 (and optional cap layer 18) atop the implanted Si-containing substrate, the substrate is then heated, i.e., annealed, at a temperature which permits interdiffusion of Ge throughout the surface Si-containing layer, Ge-containing layer 16 and, if present, the optional Si cap 18 thereby forming substantially relaxed, single crystal SiGe layer 20 atop a barrier layer 22 that is also formed during the heating step. FIG. 1C shows the resultant structure that is formed after the heating step of the present invention has been performed. Note that oxide layer 24 is formed atop layer 20 during the heating step. This oxide layer is typically, but not always, removed from the structure after the heating step using a conventional wet etch process wherein a chemical etchant such as HF that has a high selectivity for removing oxide as compared to SiGe is employed.

Note that when the oxide layer is removed, a single crystal Si layer can be formed atop layer 20 and the above processing steps of the present invention may be repeated any number of times to produce a multilayered relaxed SiGe substrate material.

The oxide layer 24 formed after the heating step of the present invention has a variable thickness which may range from about 10 to about 1000 nm, with a thickness from about 100 to about 900 nm being more highly preferred.

Specifically, the heating step of the present invention is an annealing step that is performed at a high temperature from about 900° C. to about 1350° C., with a temperature from about 1200° C. to about 1335° C. being more highly preferred. Moreover, the heating step of the present invention is carried out in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The heating step may be carried out for a variable period of time that typically ranges from about 10 to about 1800 minutes, with a time period from about 60 to about 600 minutes being more highly preferred. The heating step may be carried out at a single targeted temperature, or various ramp and soak cycles using various ramp rates and soak times can be employed.

The heating step is performed under an oxidizing ambient to achieve the presence of a surface oxide layer, i.e., layer 24, which acts as a diffusion barrier to Ge atoms. Therefore, once the oxide layer 24 is formed on the surface of the structure, Ge becomes trapped between barrier layer 22 and oxide layer 24. As the surface oxide increases in thickness, the Ge becomes more uniformly distributed throughout layers 14, 16, and optionally 18, but it is continually and efficiently rejected from the encroaching oxide layer. So as the (now homogenized) layers are thinned during this heating step, the relative Ge fraction increases. Efficient thermal mixing is achieved in the present invention when the heating step is carried out at a temperature from about 1200° C. to about 1320° C. in a diluted oxygen-containing gas.

It is also contemplated herein to use a tailored heat cycle that is based upon the melting point of the SiGe layer. In such an instance, the temperature is adjusted to tract below the melting point of the SiGe layer.

Note that if the oxidation occurs too rapidly, Ge cannot diffuse away from the surface oxide/SiGe interface fast enough and is either transported through the oxide (and lost) or the interfacial concentration of Ge becomes so high that the alloy melting temperature will be reached.

The role of the high-temperature heating step of the present invention is (1) to form a barrier layer 22 that is resistant to Ge diffusion in the Si-containing substrate: (2) to allow Ge atoms to diffuse more quickly thereby maintaining a homogeneous distribution during annealing; and (3) to subject the initial layered structure to a thermal budget which will facilitate an equilibrium configuration. After this heating step has been performed, the structure includes a uniform and substantially relaxed SiGe alloy layer, i.e., layer 20, located between the barrier layer 22 and surface oxide layer 24.

In another preferred embodiment of the present invention, the final heating step in the oxidizing ambient is not performed above 1250° C. The reasons for limiting the heating in the oxidizing ambient to a temperature below 1250° C. are to minimize surface pit formation and maintain low stacking fault defect density (less than about $10^6$ defects/cm$^2$ depending on the final SiGe thickness). In this preferred embodiment of the present invention, the applicants have determined the optimal conditions that are necessary for providing a high-quality SiGe-on-insulator substrate in which Ge loss, surface pit formation and crystal defects are substantially minimized.

In broad terms, the optimal conditions for the heating step of the present invention include the following steps:

(i) first ramping up the substrate containing implanted oxygen and at least the Ge-containing layer in an oxygen-containing gas to a first temperature that is sufficient to initiate formation of a buried oxide region in said substrate, while substantially avoiding slip generation;

(ii) first soaking at the first temperature to form a continuous buried oxide in said substrate;

(iii) second ramping up in an oxygen-containing gas from the first temperature to a second temperature that is sufficient to increase the thickness of the buried oxide in said substrate;

(iv) second soaking at said second temperature to increase and control thermal oxide thickness and to provide a sharpened interface between the SiGe layer and the buried oxide;

(v) ramping down from the second temperature to a third temperature that is less than or equal to the melting point of a final desired Ge concentration, while allowing Ge diffusion for concentration homogenization; and (vi) oxidizing at said third temperature to provide a SiGe alloy layer having said final Ge content and a thickness that is sufficient to minimize stacking faults.

In steps (iii) and (v) the conditions are also capable of substantially avoiding slip generation.

As indicated above, the first step of the optimal heating step includes a first ramp up cycle. The first ramp up cycle is performed under conditions in which slip generation is substantially avoided, while initiating the formation of a buried oxide in the substrate. The buried oxide at this step of the optimal heating step is composed mainly of oxide that is generated from implanted oxygen. The first ramp up cycle may begin at room temperature or at an initial substrate temperature that is higher than room temperature such as, for example, a temperature from about 800° C. to about 1150° C. In the case when the initial substrate temperature is higher than room temperature, an initial heating step in an inert atmosphere such as, for example, He or Ar, is employed. The first ramp up cycle is performed in the presence of an oxygen-containing gas, i.e., ambient, such as one of the oxygen-containing gases mentioned above. The oxygen-containing gas may be diluted with an inert gas such that the concentration of oxygen-containing gas in the admixture is from about 0.5 to about 10%. An example of an oxygen-containing gas that is employed during the first ramp up cycle is 1.5%.

The first ramp up cycle is performed by heating the substrate from the initial temperature to a first temperature that is in the range from about 1275° C. to about 1320° C. More preferably, the first ramp up cycle is performed until a first temperature from about 1280° C. to about 1310° C. is obtained. The rate for the first ramp up cycle is less than or equal to 1° C./min.

After the first ramp up cycle is completed, a first soak cycle is performed at the first temperature achieved by the first ramp up cycle. That is, a soak cycle is performed at a temperature from about 1275° C. to about 1320° C. The first soak cycle is performed in a gas ambient that is the same or substantially the same as the first ramp up cycle. The first soak is performed for a time period from about 0.5 to about 5 hours, with a time period from about 1 to about 2 hours being more highly preferred.

The foregoing conditions for the first soak cycle, which may also be referred to a first annealing cycle, are sufficient to complete the formation of a continuous buried oxide in the substrate.

After the first soak cycle, a second ramp up cycle is performed. The second ramp up cycle is carried out from the first temperature of the first soak cycle to a second temperature which is from about 1315° C. to about 1335° C. More preferably, the second ramp up is performed until a second temperature from about 1320° C. to about 1330° C. is obtained. The rate for the second ramp up cycle is less than or equal to 1° C./min. The second ramp up cycle is performed in an oxygen-containing gas that is typically admixed with an inert gas. For example, the second ramp up cycle may be performed in an admixture of 10% or greater oxygen-containing gas and 90% or less inert gas. In one preferred embodiment, the second ramp up is performed in 50% oxygen and 50% Ar.

During the second ramp up cycle, the conditions are selected such that the thickness of the buried oxide layer increases. The thickness of the buried oxide is increased by an internal thermal oxidation process. As known to those skilled in the art, thermal oxides typically are of better quality than oxides that are formed from implanted oxygen.

Thus, a second soak cycle at the temperature range mentioned above is employed in the present invention to increase the thickness of the thermal oxide formed. In addition to increasing the thickness of the thermal oxide formed, the second soak cycle also helps to sharpen the interface between the buried oxide and the overlying SiGe layer that also begins to form via Ge diffusion and homogenization. The term "sharpen" is used in the present invention to denote that during this step of the present invention the interface between the buried oxide and the overlying SiGe alloy becomes planarized, i.e., the waviness of the interface is substantially minimized.

The second soak cycle is typically performed in the same or substantially the same ambient as the second ramp up cycle. The second soak cycle is performed for a time period from about 1 to about 10 hours, with a time period from about 3 to about 6 hours being more highly preferred.

After completion of the second soak cycle, a ramp down cycle is performed. The ramp down cycle is performed from the second temperature of the second soak cycle to a third temperature that is at or below the melting point of the final desired SiGe concentration, while still allowing Ge diffusion for alloy homogenization. Specifically, the ramp down is performed to a temperature that is from about 1350° C. to about 1150° C., with a temperature from about 1300° C. to about 1200° C. being more highly preferred. The third temperature achieved by the ramp down cycle is dependent on the final Ge concentration in the SiGe layer.

The ramp down cycle can be performed at a rate that is less than or equal to 1° C./min. The ramp down cycle is performed in the same or substantially the same ambient as the second soak cycle or in an inert ambient.

After completion of the ramp down cycle, the substrate is oxidized in either the same or substantially the same ambient as the previous cycle, 100% oxygen or steam, or under any oxidation conditions that are sufficient to obtain a final Ge fraction in the SiGe alloy layer, yet provide a SiGe alloy layer that is thick enough to minimize stacking faults. Specifically, the oxidizing cycle is performed at the third temperature achieved by the ramp down cycle for a time period from about 1 to about 10 hours, with a time period from about 1 to about 5 hours being more highly preferred.

The above cycles along with their optimal conditions are used in some embodiments of the present invention to obtain a high-quality SiGe-on-insulator in which (i) Ge loss is minimized, (ii) pit formation is minimized, and (iii) SiGe crystal defects are minimized.

After performing the oxidation cycle, the substrate is ramped down to nominal room temperature, removed from the heating apparatus and the resulting surface oxide layer 24 is removed as discussed herein. The SiGe alloy layer 20 of the resultant SiGe-on-insulator substrate material can then be subjected to a non-selective thinning step. The non-selective thinning step is employed in the present invention to further remove surface pit defects from the SiGe alloy layer 20. Illustrative examples of non-selective thinning processes that can be employed in the present invention include, but are not limited to: chemical mechanical polishing (CMP), grinding, high-pressure oxidation, wet etching, steam oxidation, gas-cluster beam thinning and any combination thereof. In one preferred embodiment, CMP is employed as the non-selective thinning technique. The surface roughness of the relaxed SiGe layer after the non-selective thinning process is performed is typically about 1.5 nm (RMS) or less.

In accordance with the present invention, the substantially relaxed SiGe layer 20 has a thickness of about 2000 nm or less, with a thickness from about 10 to about 100 nm being more highly preferred. The barrier layer 22 formed during the annealing step of the present invention has a thickness of about 500 nm or less, with a thickness from about 50 to about 200 nm being more highly preferred. Note that the substantially relaxed SiGe layer 20 formed in the present invention is thinner than prior art SiGe buffer layers and has a defect density including misfits and TDs, of less than about $5 \times 10^7$ defects/cm$^2$. This defect density value approaches those reported for contemporary SGOI materials. When the optimal conditions are employed, the SiGe layer 20 has a stacking fault defect density that is about 1000 defects/cm$^2$ or less.

The substantially relaxed SiGe layer 20 formed in the present invention has a final Ge content from about 0.1 to about 99.9 atomic percent, with an atomic percent of Ge from about 10 to about 35 being more highly preferred. Another characteristic feature of the substantially relaxed SiGe layer 20 is that it has a measured lattice relaxation from about 1 to about 100%, with a measured lattice relaxation from about 50 to about 80% being more highly preferred.

Figure 2C:
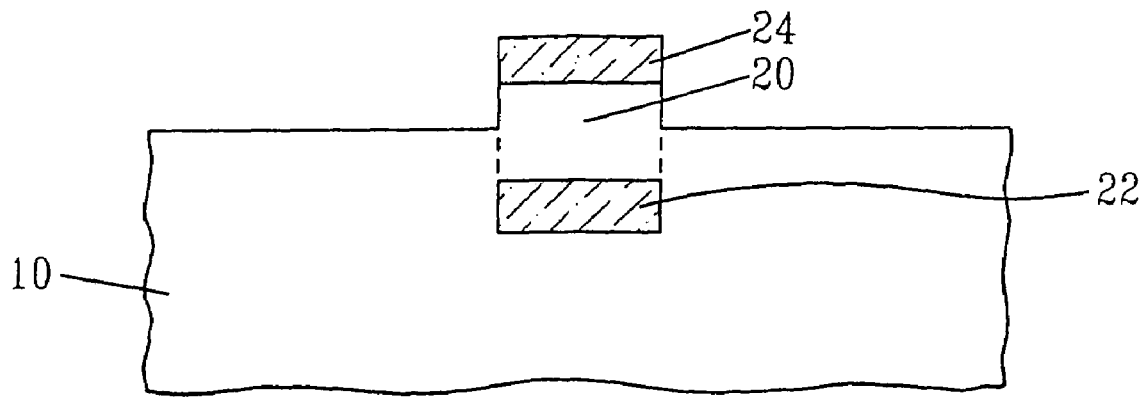
Figure 2D:
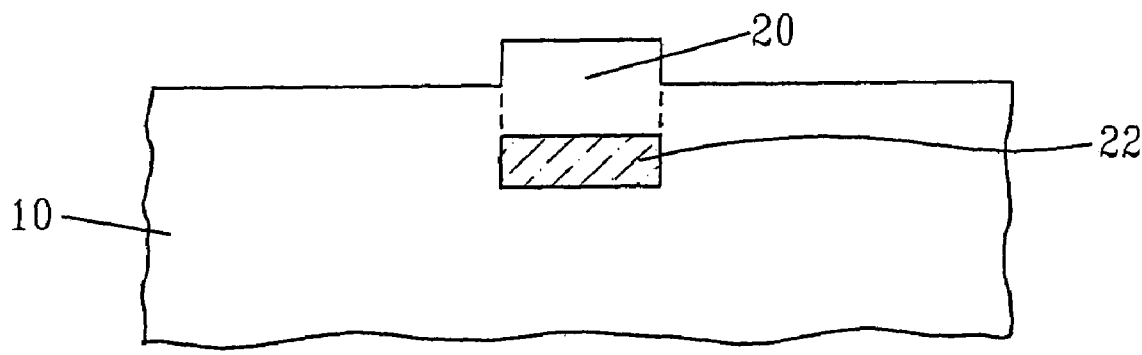

As stated above, the surface oxide layer 24 may be stripped at this point of the present invention so as to provide the SiGe-on-insulator substrate material shown, for example, in FIG. 2D (note that the substrate material does not include the cap layer since that layer has been used in forming the relaxed SiGe layer).

FIGS. 2A–2D show an embodiment of the present invention in which a patterned barrier layer 22 is formed. In this embodiment of the present invention, a masked ion implantation step such as shown in FIG. 2A is performed. In FIG. 2A, reference numeral 15 denotes an implantation mask that is used in this embodiment of the present invention. The implantation mask shown in FIG. 2A is formed using conventional techniques well know in the art. Although the implantation mask 15 may be removed after the implant step shown in FIG. 2A, it may also remain on the structure during the formation of Ge-containing layer 16, See FIG. 2B. After forming the Ge-containing layer 16, the mask 15 may be removed at this point of the present invention. Implantation mask removal is carried out using conventional stripping processes well known to those skilled in the art. FIG. 2C shows the structure after the heating step and FIG. 2D shows the structure after removing oxide layer 24. Note the implantation mask may remain on the structure throughout the entire process.

Figure 1D:
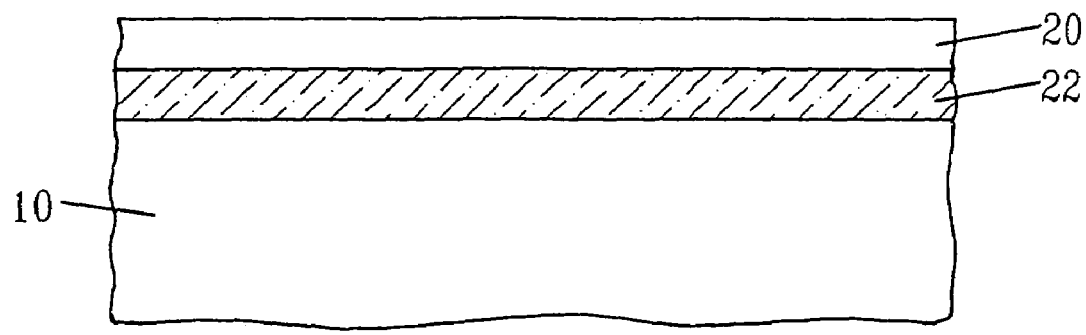
Figure 4A:
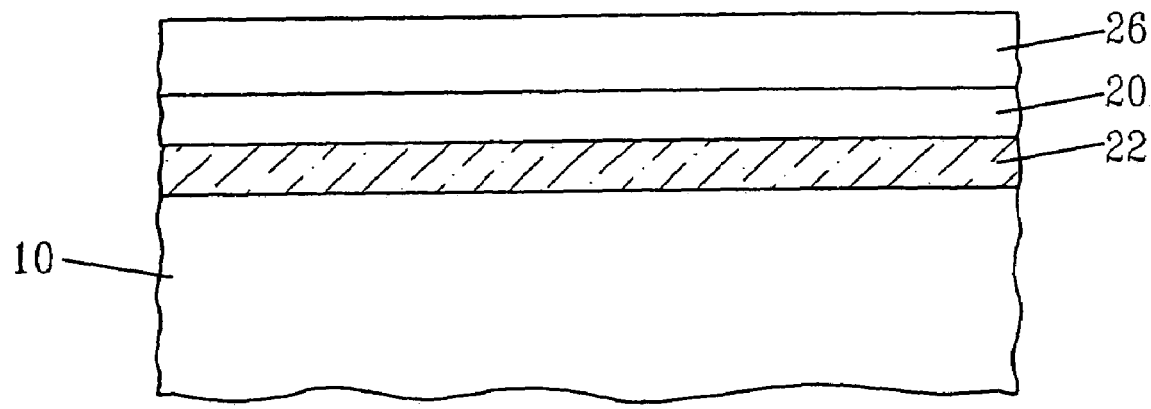
FIGS. 4A–4B are pictorial representations (through cross-sectional views) showing the formation of a strained Si-containing layer on the thin, high-quality, substantially relaxed SiGe-on-insulator substrate material of FIGS. 1D and 2D, respectively.
Figure 4B:
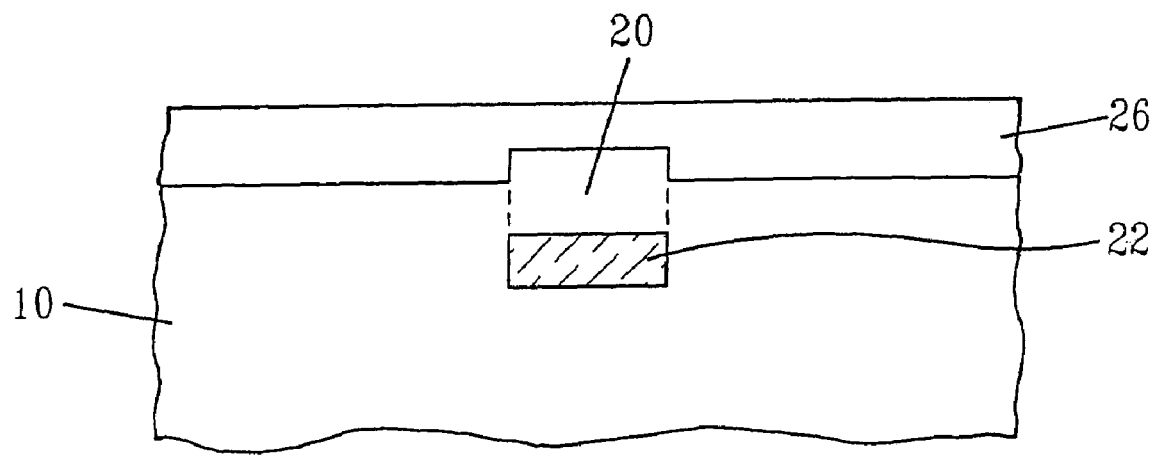

FIGS. 4A–B show the structure that is obtained after forming a Si-containing layer 26 atop the SiGe layer 20 of FIGS. 1D and 2D, respectively. Si-containing layer 26 is formed using a conventional epitaxial deposition process well known in the art. The thickness of the epi-Si layer 26 may vary, but typically, the epi-Si layer 26 has a thickness of from about 1 to about 100 nm, with a thickness of from about 1 to about 30 nm being more highly preferred.

In some instances, additional SiGe can be formed atop the substantially relaxed SiGe layer 20 utilizing the above mentioned processing steps, and thereafter epi-Si layer 26 may be formed. Because layer 20 has a large in-plane lattice parameter as compared to epi-layer 26, epi-layer 26 will be strained in a tensile manner.

As stated above, the present invention also contemplates superlattice structures as well as lattice mismatched structures which include at least the SiGe-on-insulator substrate material of the present invention. In the case of superlattice structures, such structures would include at least the substantially relaxed SiGe-on-insulator substrate material of the present invention, and alternating layers Si and SiGe formed atop the substantially relaxed SiGe layer of the substrate material.

In the case of lattice mismatched structures, GaAs, GaP or other like III/V compounds would be formed atop the substantially relaxed SiGe layer of the inventive SiGe-on-insulator substrate material.

It should be noted that any of the foregoing embodiments, i.e., patterning, epi Si growth, SiGe growth and supperlattice formation can be used in conjunction with the optimal conditions mentioned above.

Figure 5:
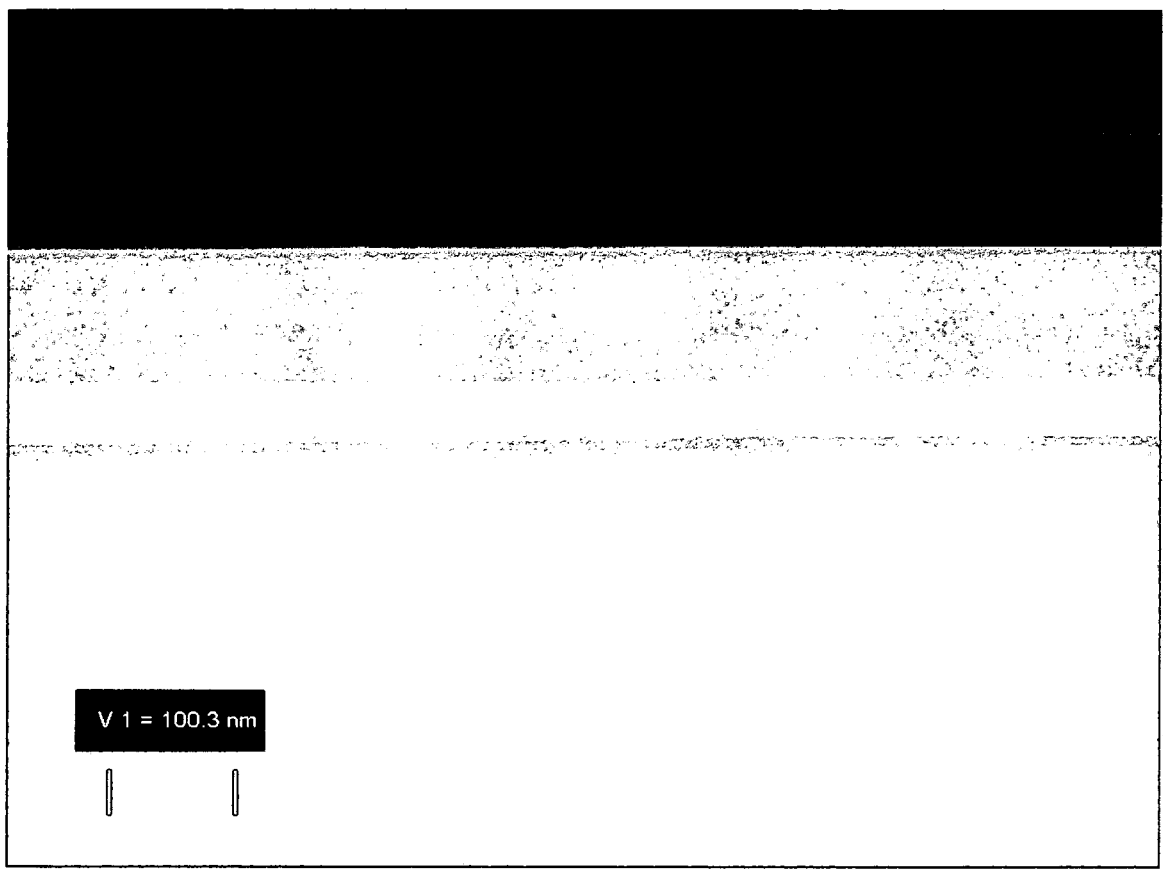
FIG. 5 is a SEM of a SiGe-on-insulator substrate material formed using the processing steps of the present invention.

FIG. 5 is an actual SEM of a substantially relaxed SiGe-on-insulator substrate material that was formed using the method of the present invention (with the surface oxide stripped off). In particular, the SiGe-on-insulator substrate material shown in FIG. 5 was prepared by first implanting oxygen ions into a Si-containing wafer using implant conditions that fall within the ranges mentioned above. A 600 Å-17% SiGe alloy layer was then grown atop the implanted Si-containing substrate and thereafter a single anneal/oxidation was carried out at 1320° C. in a Ar—$O_2$ atmosphere. In the image, the top (black) region is the area above the sample (SEM chamber). The first light-gray layer is the SGOI layer, below that is a darker gray band which is the buried oxide layer (BOX) formed during the high-temperature step. The light gray layer below the BOX is the Si substrate. X-ray diffraction showed that the SiGe layer (94.2 nm) contained 4 atomic % Ge and was 92% relaxed. The buried oxide had a thickness of about 47.10 nm and was continuous and well-formed.

In summary, the SiGe-on-insulator substrate material is formed in the present invention as an integrated process that combines the benefits of the high temperature SIMOX anneal with the simplicity of the Ge diffusion and segregation method of forming SiGe-on-insulators.

The following example illustrates SiGe-on-insulator substrate materials formed using the optimal implant, growing and thermal conditions mentioned above.

EXAMPLE

In this example, SiGe-on-insulator substrate materials were fabricated using optimal conditions that fall within the ranges mentioned above. Table 1 indicates the initial samples, oxygen implant conditions (base and second implants) and the thickness and Ge content of the Ge-containing layer grown on top of the substrate prior to oxygen implanting and heating. The heating step used in this example is as follows:

ramp up from 1150° C. to 1300° C. at 0.5° C./min in 1.5% oxygen (Ar dilution);

soak at 1300° C. for 2 hours;

ramp up to 1325° C. at 0.1° C./min in an ambient comprising 50.3% oxygen and 49.7% Ar;

soak at 1325° C. for 6 hours;

ramp down to 1200° C. at 0.5° C./min;

oxidize at 1200° C. for 3 hours in 40% oxygen; and cool down.

Following these heating steps, the following steps were also performed:

(viii) Oxide removal in 10:1 ($H_2O$:HF) plus RCA-based wafer cleaning.

(ix) Chemical-mechanical polishing and post-CMP clean (x) Epitaxial growth of strained Si layer

TABLE 1

| Sample | $O^+$ Implant | Original top layer thickness (Å) | SGOI thickness (Å) | BOX thickness (Å) | Final Ge fraction (%) | Relaxation (%) | $(\Delta d/d)_{//}$ (%) | Ge loss (%) |
|---|---|---|---|---|---|---|---|---|
| Process A | 2.1E17/169 keV; 2.5E15/159 keV | 1500 SiGe (20%) | 607 | 1031 | 12.2 | 73.3 | 0.333 | 31 |
| Process B | 2.1E17/169 keV; 2.5E15/159 keV | 1000 SiGe (20%) | 596 | 1158 | 12.1 | 60.1 | 0.271 | 35 |

Table 1 also includes data for the final SGOI substrate material. In particular, the BOX thickness, Ge fraction, relaxation, $(\Delta d/d)_{//}$ (which is the in-plane lattice parameter given in terms of % greater than Si), and Ge loss are provided in Table 1. The high relaxation and relatively low Ge loss (~30%) combined with the low defectivity (less than 10 stacking faults/cm$^2$), excellent electrical buried oxide properties (first mini-breakdown field greater than 6 MV/cm) and low surface roughness (3 Å RMS) of the substrates produced in the Example method make them a suitable cost-effective substrate for use in CMOS manufacturing. By reducing the ramping rates during steps (i), (iii) and (v) compared to the Example, the Ge loss was further reduced to 19%.

Figure 6A:
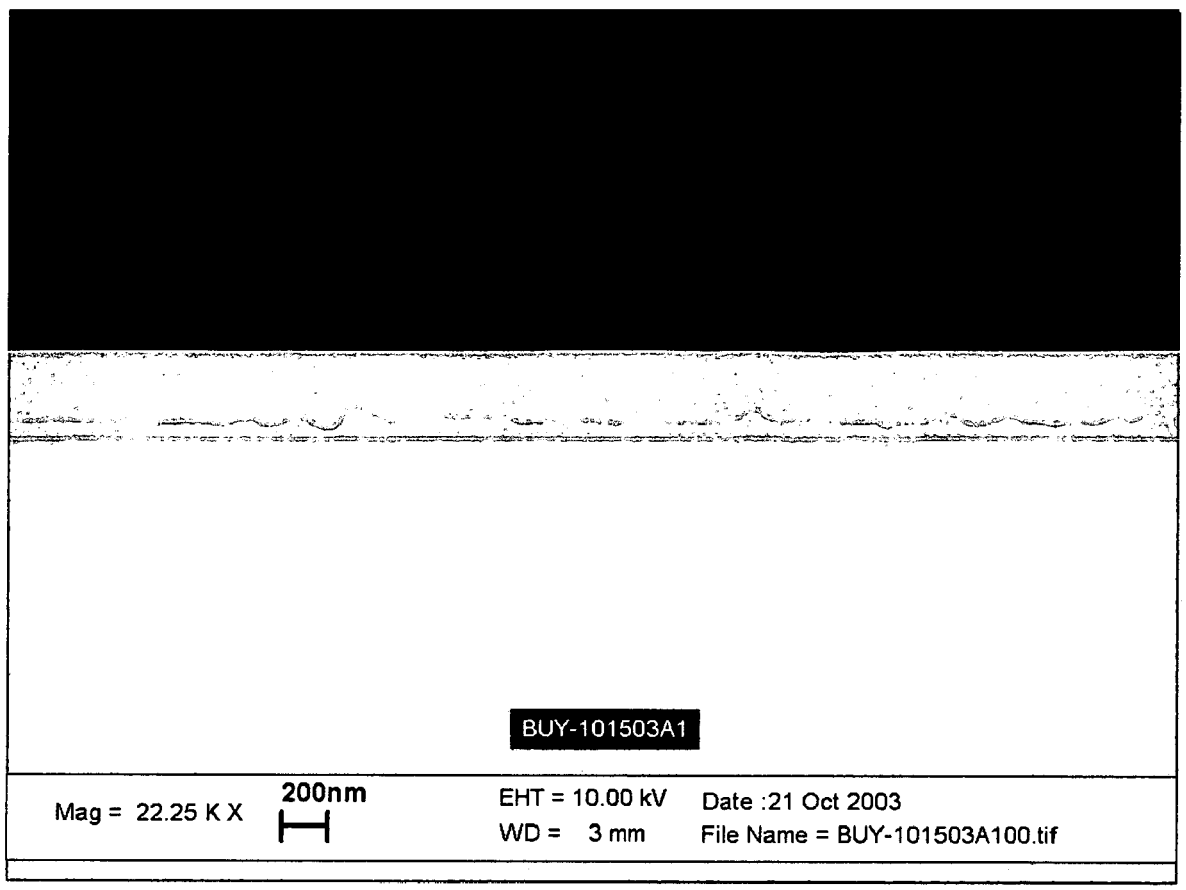
FIGS. 6A–6B are SEMs of a SiGe-on-insulator substrate material formed using the optimal conditions described in the Example.
Figure 6B:
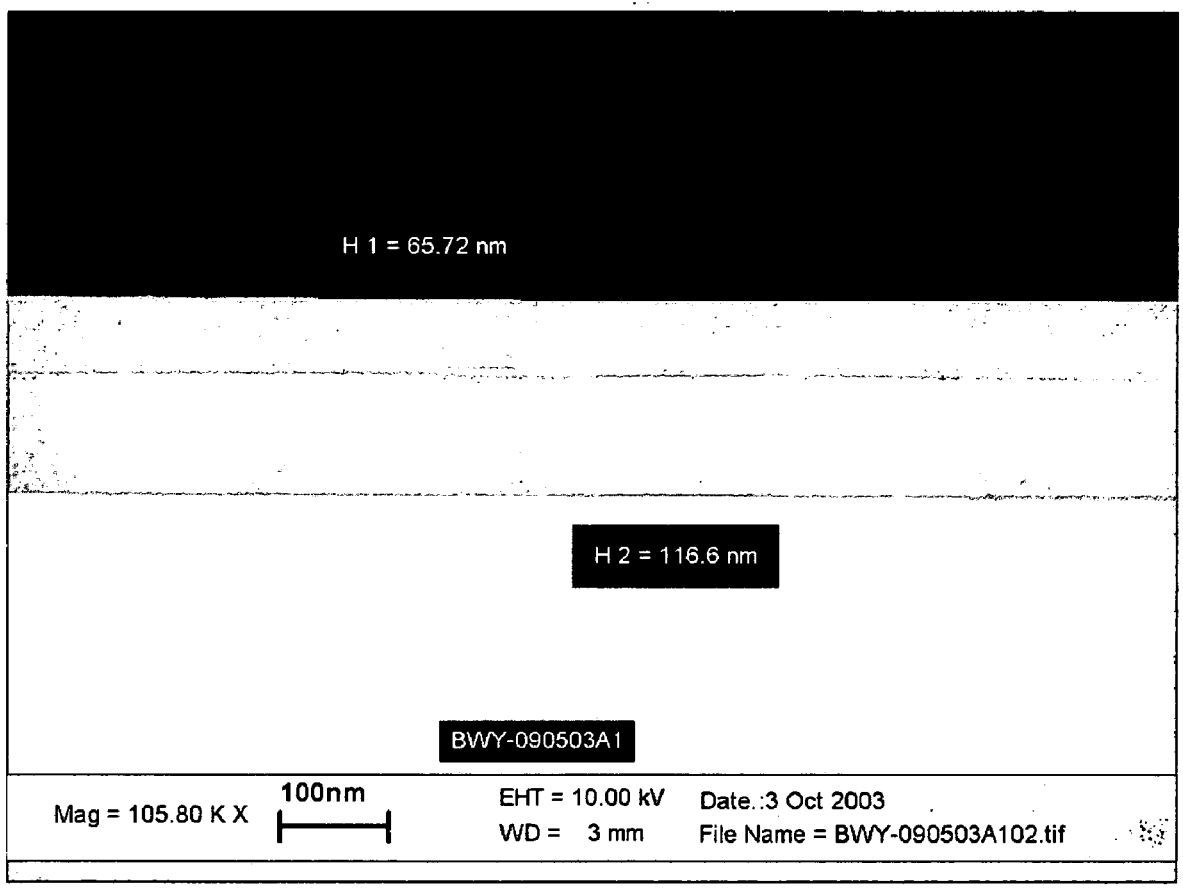

FIG. 6A shows a SEM cross-section (X-SEM) image of the Si/SGOI structure formed using the preferred embodiment in the Example (Process B) after the first ramp step to 1300° C. The buried oxide has been formed but it is thin and has a rough upper interface. FIG. 6B is a X-SEM image of the same structure (Process B) as shown in FIG. 6A that has completed all the thermal processing steps (through step viii). The role of steps (iii) and (iv) are clearly shown to both increase the thickness of the buried oxide layer and to sharpen the upper interface.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

The invention claimed is:

1. A method of producing a substantially relaxed, high-quality SiGe-on-insulator substrate material comprising the steps of:
    subjecting a Si-containing substrate to a base oxygen ion implant step to form a damaged region that has an oxygen ion concentration that is sufficient to act as a diffusion barrier to Ge;
    subjecting the Si-containing substrate having said damaged region to a second oxygen implant step to form an amorphous region that is shallower than the damaged region, said amorphous region having a surface layer of the Si-containing substrate thereon;
    forming a Ge-containing layer atop the surface layer of the Si-containing substrate, said Ge-containing layer having a thickness from about 50 to about 500 nm and a Ge content from about 5 to about 40 atomic %;
    heating the substrate to form a substantially relaxed SiGe layer atop said diffusion barrier layer, said heating comprises:
    (i) first ramping up the substrate in an oxygen-containing gas to a first temperature that is sufficient to initiate formation of a buried oxide region in said substrate, while substantially avoiding slip generation;
    (ii) first soaking at the first temperature to form a continuous buried oxide in said substrate;
    (iii) second ramping up in an oxygen-containing gas from the first temperature to a second temperature that is sufficient to increase the thickness of the buried oxide in said substrate;
    (iv) second soaking in an oxygen-containing gas at said second temperature to increase and control the thermal oxide thickness and to provide a sharpened interface between the relaxed SiGe layer and the buried oxide;
    (v) ramping down from the second temperature to a third temperature that is less than or equal to the melting point of a final desired Ge concentration, while allowing Ge diffusion for concentration homogenization; and
    (vi) oxidizing at said third temperature to provide the relaxed SiGe layer having said final Ge content and a thickness that is sufficient to minimize stacking faults.

2. The method of claim 1 wherein said base oxygen implant step is performed at an energy from about 100 to about 220 keV and at a dose from about 1.5E17 to about 3E17 cm$^{-2}$.

3. The method of claim 2 wherein the base oxygen implant step is performed at an energy from about 150 to about 175 keV and at a dose from about 1.8E17 to about 2.75E17 cm$^{-2}$.

4. The method of claim 1 wherein said base oxygen implant is performed at a temperature from about 200° C. to about 600° C. at a beam current density from about 0.01 to about 0.1 milliamps cm$^{-2}$.

5. The method of claim 1 wherein the second oxygen implant is performed at an energy from about 100 to about 220 keV and at a dose from about 1E15 to about 3E15 cm$^{-2}$.

6. The method of claim 5 wherein the second oxygen implant is performed at an energy from about 150 to about 170 keV and at a dose from about 2E15 to about 2.75E15 cm$^{-2}$.

7. The method of claim 1 wherein the second oxygen implant is performed at an implant temperature from about −200° C. to about 150° C. and at a beam current density from about 0.001 to about 0.01 mA cm$^{-2}$.

8. The method of claim 1 wherein the Ge-containing layer is formed by an epitaxial growth process selected from the group consisting of low-pressure chemical vapor deposition, atmospheric pressure chemical vapor deposition, ultra-high vacuum chemical vapor deposition, molecular beam epitaxy, and plasma-enhanced chemical vapor deposition.

9. The method of claim 8 wherein with a Ge source used during said epitaxial growth process is isotopically enriched in any naturally occurring masses.

10. The method of claim 1 wherein said Ge-containing layer has a thickness from about 100 to about 200 nm and a Ge content from about 15 to about 25 atomic %.

11. The method of claim 1 further comprising forming a Si-containing cap layer atop said Ge-containing layer prior to said heating.

12. The method of claim 11 wherein said Si-containing cap layer comprises epi-Si, epi-SiGe, a:Si, a:SiGe, single or polycrystalline Si or any combination and multilayer thereof.

13. The method of claim 1 wherein a Si-containing buffer layer is formed atop said Si-containing substrate prior to the formation of said Ge-containing layer.

14. The method of claim 1 wherein a surface oxide layer forms during said heating.

15. The method of claim 14 further comprising removing said surface oxide layer utilizing a wet chemical or reactive-ion etch process.

16. The method of claim 1 further comprising a step of subjecting the relaxed SiGe layer to a non-selective thinning process after said heating.

17. The method of claim 16 wherein the non-selective thinning process comprises chemical mechanical polishing, grinding, high-pressure oxidation, wet etching, steam oxidation, gas-cluster beam thinning or any combination thereof.

18. The method of claim 17 wherein the non-selective thinning process is chemical mechanical polishing.

19. The method of claim 1 wherein the first temperature of said first ramp up is from about 1275° C. to about 1320° C.

20. The method of claim 1 wherein the first ramp up is performed using a rate of less than or equal to 1° C./min.

21. The method of claim 1 wherein the oxygen-containing gas may further be diluted with an inert gas.

22. The method of claim 1 wherein said first soak is performed for a period of time from about 0.5 to about 5 hours using the same or substantially the same oxygen-containing gas as the first ramp up.

23. The method of claim 1 wherein the second temperature of the second ramp up is from about 1315° C. to about 1335° C.

24. The method of claim 23 wherein said second ramp up is performed at a rate of less than or equal to 1° C./min.

25. The method of claim 1 wherein the second ramp up is performed in an oxygen-containing gas that is admixed with an inert gas.

26. The method of claim 1 wherein the second soaking is performed for a time period from about 1 to about 10 hours in the same or substantially the same ambient as used in the second ramp up.

27. The method of claim 1 wherein the third temperature of said ramping down is from about 1300° C. to about 1200° C.

28. The method of claim 1 wherein said ramp down is performed at a rate of less than or equal to 1° C./min.

29. The method of claim 1 wherein said oxidizing is performed in 100% oxygen, steam or an oxygen-containing gas that is diluted with an inert gas.

30. The method of claim 1 wherein the oxidizing is performed for a time period from about 1 to about 10 hours.

31. The method of claim 1 further comprising growing an additional SiGe layer atop said substantially relaxed SiGe layer.

32. The method of claim 31 further comprising forming a strained Si-containing layer atop said additional SiGe layer.

33. The method of claim 1 further comprising forming a strained Si-containing layer atop said substantially relaxed SiGe layer.

* * * * *